(12) United States Patent
Derungs

(10) Patent No.: US 9,448,323 B2
(45) Date of Patent: Sep. 20, 2016

(54) DEVICE AND METHOD FOR DETECTING METALLIC CONTAMINANTS IN A PRODUCT

(71) Applicant: Mettler-Toledo Safeline Ltd., Manchester (GB)

(72) Inventor: Max Derungs, Bolton (GB)

(73) Assignee: METTLER-TOLEDO SAFELINE LTD., Manchester (GB)

( * ) Notice: Subject to any disclaimer, the term of this patent is extended or adjusted under 35 U.S.C. 154(b) by 663 days.

(21) Appl. No.: 13/918,285

(22) Filed: Jun. 14, 2013

(65) Prior Publication Data

US 2013/0338953 A1 Dec. 19, 2013

(30) Foreign Application Priority Data

Jun. 15, 2012 (EP) .................................. 12172238

(51) Int. Cl.
| | |
|---|---|
| *G01V 3/08* | (2006.01) |
| *G01V 3/10* | (2006.01) |
| *G01V 3/38* | (2006.01) |
| *G01R 33/12* | (2006.01) |

(52) U.S. Cl.
CPC . *G01V 3/38* (2013.01); *G01V 3/10* (2013.01); *G01R 33/12* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,676,772 | A | * 7/1972 | Lee | ................ 324/233 |
| 5,045,789 | A | 9/1991 | Inoue et al. | |
| 2003/0105600 | A1 | 6/2003 | Alvi | |

FOREIGN PATENT DOCUMENTS

| | | |
|---|---|---|
| EP | 0353035 A2 | 1/1990 |
| EP | 0490921 B1 | 4/1994 |
| WO | 88/03273 A1 | 5/1988 |

* cited by examiner

*Primary Examiner* — Huan Tran
(74) *Attorney, Agent, or Firm* — Standley Law Group LLP

(57) ABSTRACT

A device and associated method for detecting metallic contaminants in a product using a signal received from a coil-based metal detector. A calibration module is configured to determine a product-specific, bowtie-shaped detection envelope based on calibration phase metal detector signals. A detection module is configured to compare, in a coordinate system for resistive and reactive components of a metal detector signal, a vector representation of the signal to the product-specific, bowtie-shaped detection envelope, and to indicate a presence of a metallic contaminant in the product when the vector representation of the signal extends to an area outside the bowtie-shaped detection envelope.

11 Claims, 9 Drawing Sheets

DEVICE AND METHOD FOR DETECTING METALLIC CONTAMINANTS IN A PRODUCT

CROSS-REFERENCE TO RELATED APPLICATIONS

This application is entitled to benefit of a right of priority under 35 USC §119 from European patent application 12172238.3, filed 15 Jun. 2012, which is incorporated by reference as if fully recited herein.

TECHNICAL FIELD

Embodiments of the invention are directed to devices and methods for detecting metallic contaminants in a product.

BACKGROUND

For various reasons, including safety and health concerns, it is necessary to detect metallic contaminants in various non-metallic consumer goods such as food, pharmaceutical or textile products. Typically, coil based metal detectors are used to scan such products for unwanted inclusions of metals or other electrolytes. Signals created by various metals or products as they pass through or by the coils of a metal detector can be split into a resistive and a reactive component, according to the conductivity and magnetic permeability of the metal and product. When the particles are small, the signal from ferrous metal (iron) is primarily reactive, while the signal from stainless steel is primarily resistive.

US2003/0105600 describes an apparatus for detecting contamination of an object by a metal or other electrolyte. The apparatus according to US2003/0105600 comprises a metal detector associated with a computer programmed to compare the observed signal provided by the metal detector with a stored calibration signal corresponding to an object with an acceptable level of contamination, and to identify when an observed signal received from the metal detector deviates by an unacceptable amount from that calibration signal.

U.S. Pat. No. 5,045,789 describes a detector for detecting foreign matter in an object by using discriminating electromagnetic parameters. According to U.S. Pat. No. 5,045,789, in a coordinate system showing the resistive (in phase) and reactive (90° phase delay) components of a detection signal, an elliptic region is defined to represent expected signal values for a product without contaminants. Detection signals with a value or a vector lying outside this elliptic region are judged to represent products which contain foreign matter. Defining an elliptic detection envelope based on actual measurements of the product has the advantage that the elliptic detection envelope is aligned with the product signal, i.e. product compensation is achieved in that the phase of the detection envelope is aligned with the phase of the product. Consequently, even the signal of a highly conductive product, such as meat or cheese, does not pass outside the detection envelope. However, as a negative consequence, large signals from stainless steel are needed to pass outside the detection envelope and, thus, the detector becomes less sensitive to these metals.

SUMMARY

Devices and a methods of the invention are operative to detect metallic contaminants in a product, while lacking at least some of the disadvantages of the prior art. In particular, devices and methods of the invention are able to detect metallic contaminants in a product whereby the phase of the product is taken into consideration in the detection, while metal sensitivity is maintained or at least reduced less than in known systems.

Exemplary embodiments of the invention are usable to detect metallic contaminants in a product using a signal received from a coil-based metal detector, the signal comprising a resistive component and a reactive component. A vector representation of the signal is compared to a product-specific, bowtie-shaped detection envelope in a coordinate system for the resistive and reactive components. The presence of a metallic contaminant in the product is indicated when the vector representation of the signal extends to an area outside the bowtie-shaped detection envelope. Using a product-specific, bowtie-shaped detection envelope allows metallic contaminants to be detected with an alignment of the detection envelope to the phase orientation of the specific product, while the detection sensitivity with respect to metallic contaminants is maintained or at least reduced to a lesser degree than in known systems.

In one exemplary embodiment, for example, the product-specific, bowtie-shaped detection envelope is determined by receiving from the metal detector, during a calibration phase, signals for one or more specimens or samples of the product. The phase orientation and dimensions of the bowtie-shaped detection envelope are determined using the signals. The bowtie-shaped detection envelope has two wings which extend from a center of the bowtie-shaped detection envelope in opposite directions along a longitudinal axis to respective ends of the bowtie-shaped detection envelope. The width of the ends of the bowtie-shaped detection envelope is greater than the width of the center of the bowtie-shaped detection envelope. The determined dimensions include the width at the center of the bowtie-shaped detection envelope, the width at the ends of the bowtie-shaped detection envelope, the length of the bowtie-shaped detection envelope along its longitudinal axis, and/or an acute angle between the longitudinal axis and the outer edge of the bowtie-shaped detection envelope, which outer edge extends from the center to the ends of the bowtie-shaped detection envelope.

In a further embodiment, the resistive and reactive components of the signals received from the metal detector during the calibration phase are converted into polar coordinates, comprising a phase value and a magnitude value. A product envelope is determined by determining and storing during the calibration phase a peak magnitude value for each of the phase values and the bowtie-shaped detection envelope is defined using the product envelope.

In an embodiment, determining the phase orientation of the bowtie-shaped detection envelope comprises applying a weighting function to the peak magnitude values stored for the phase values.

In one exemplary embodiment, determining the dimensions of the bowtie-shaped detection envelope comprises aligning the phase orientation with an axis of a coordinate system selected as the alignment axis, generating a quadrant overlay of the product envelope through reflection of the product envelope about the axes of the coordinate system, determining measurements of the quadrant overlay, and determining the dimensions of the bowtie-shaped detection envelope using the measurements.

In an exemplary embodiment, a maximum extension of the quadrant overlay is determined in the direction of the alignment axis and the length of the bowtie-shaped detection envelope is determined using the maximum extension in the direction of the alignment axis. Moreover, a maximum extension of the quadrant overlay is determined on the axis of the coordinate system orthogonal to the alignment axis and the width at the center of the bowtie-shaped detection envelope is determined using the maximum extension of the quadrant overlay on the orthogonal axis.

In a further exemplary embodiment, a tangent onto the quadrant overlay is determined in one of the quadrants of the coordinate system. The tangent runs through a maximum extension of the quadrant overlay on the axis of the coordinate system orthogonal to the alignment axis. The acute angle and/or the width at the ends of the bowtie-shaped detection envelope are determined using the tangent.

In addition to a device and a method for detecting metallic contaminants in a product using a signal received from a coil-based metal detector, the invention also relates to a computer program product comprising computer program code for directing a computer system to perform the method of detecting metallic contaminants in a product using a signal received from a coil-based metal detector. The computer program product may be a computer-readable medium having the computer program stored thereon.

Other aspects and features of the invention will become apparent to those skilled in the art upon review of the following detailed description of exemplary embodiments along with the accompanying drawing figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1:
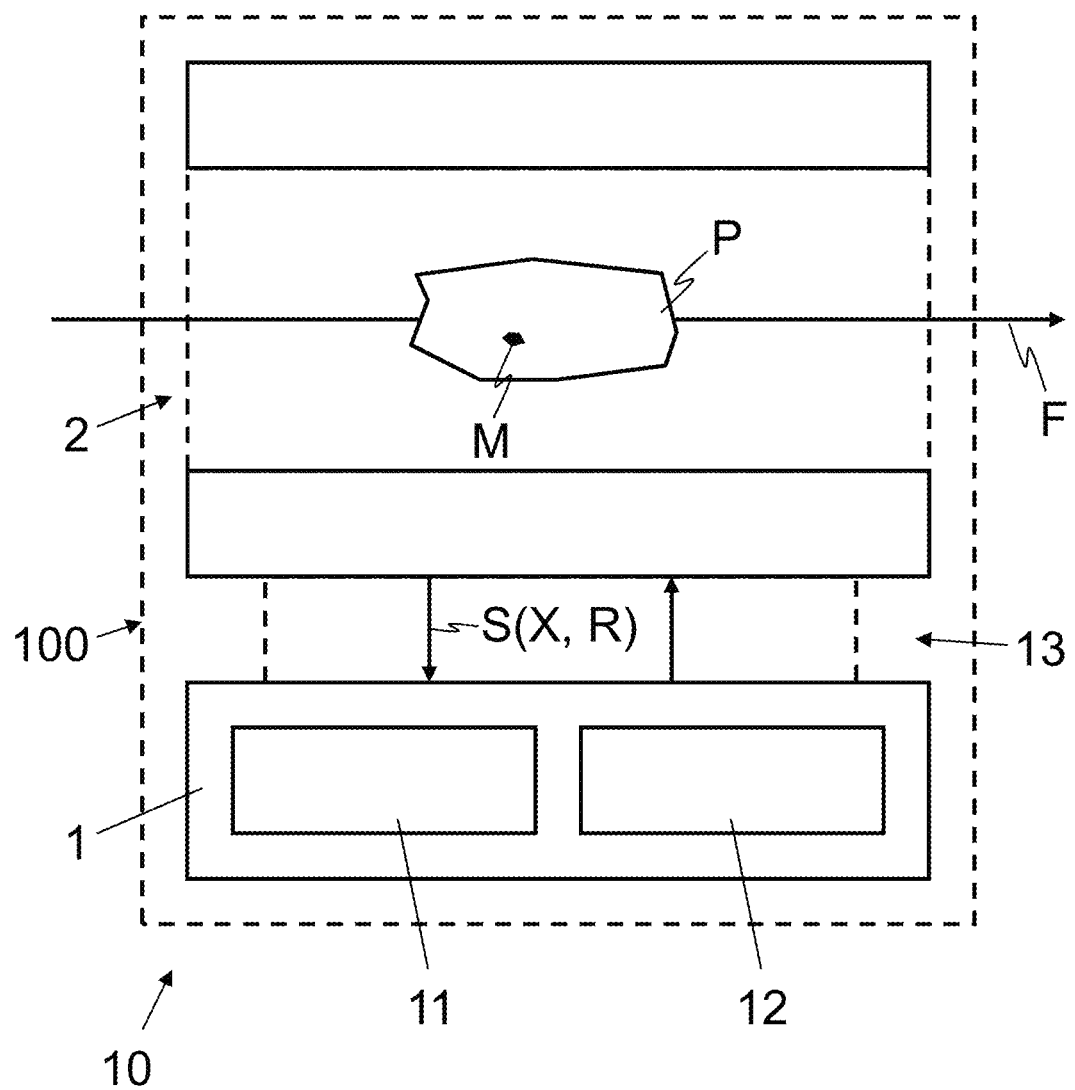
FIG. 1 is a block diagram illustrating schematically a coil-based metal detector and a device for detecting metallic contaminants in a product using a signal received from the metal detector.

In FIG. 1, reference numeral 10 refers to a detection system for detecting metallic contaminants M in a product P, e.g. a food product, a pharmaceutical product, a textile product, or another (non-metallic) consumer good product. The detection system 10 comprises a conventional coil-based metal detector 2 and a processing device 1 for detecting the metallic contaminants M in the product P using a signal S received from the coil-based metal detector 2. The metal detector 2 comprises a transport system, e.g. a conveyer belt, configured to transport a flow F of products P through the metal detector 2 during calibration and measurement phases Ph1, Ph2. As is illustrated schematically in FIG. 1, in one embodiment, the metal detector 2 and the processing device 1 are integral in one common housing 100; alternatively, the metal detector 2 and the processing device 1 are arranged in separate housings. The metal detector 2 and the processing device 1 are interconnected by way of a signal interface 13.

As illustrated in FIG. 1, the processing device 1 comprises several functional modules, specifically, a calibration module 11 and a detection module 12. Preferably, the processing device 1 comprises an operable computer, including one or more processors, and the functional modules are implemented as programmed software modules, comprising computer program code for directing the processor(s) of the computer to perform various functions, outlined below. The computer program code is stored on a computer program product which is arranged fixed or removably in the processing device 1. Alternatively, the functional modules are implemented fully or at least partly by way of hardware components.

Figure 2:
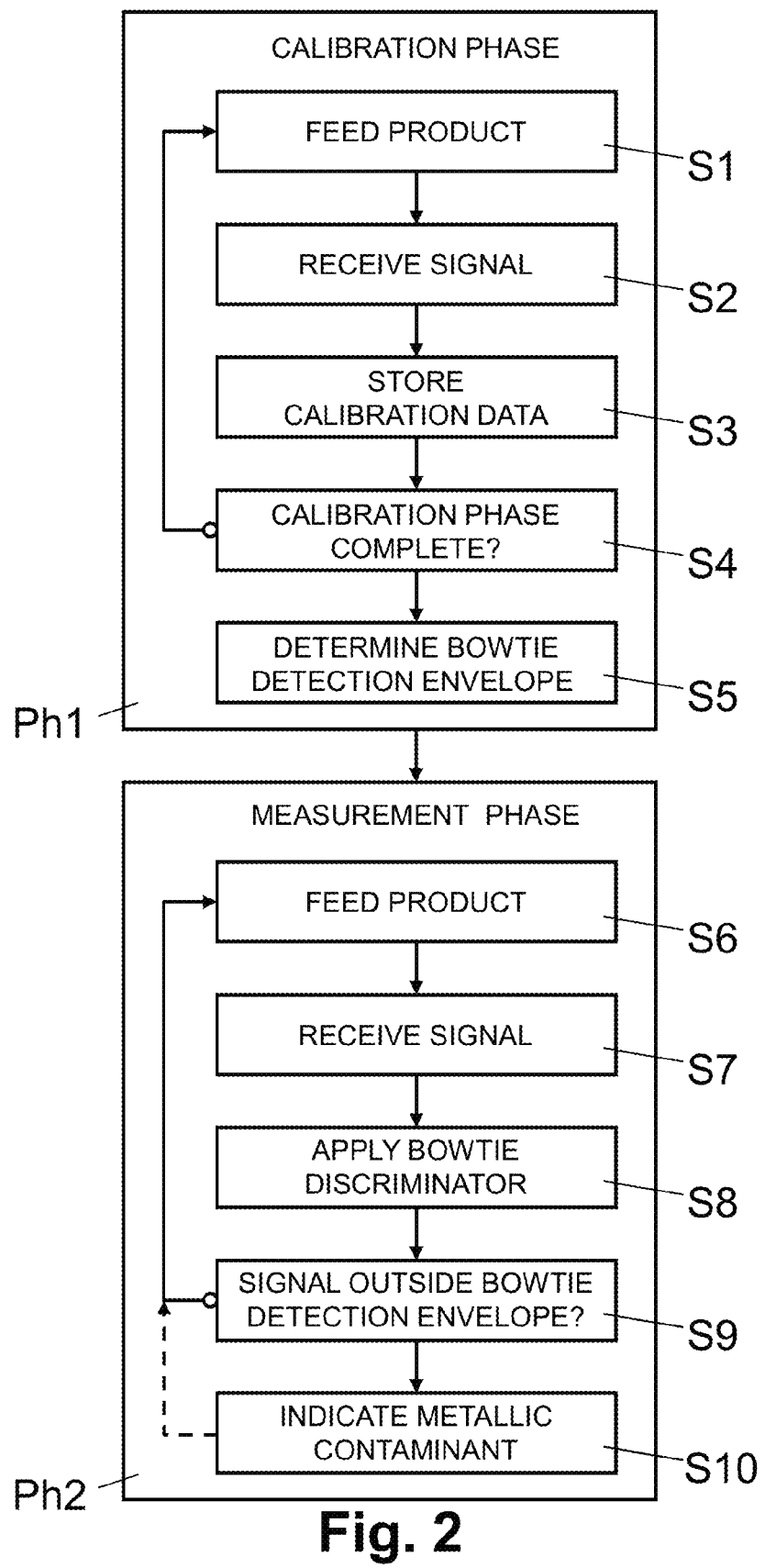
FIG. 2 is a flow diagram illustrating an exemplary sequence of steps for determining a product-specific, bowtie-shaped detection envelope and detecting metallic contaminants in a product using the bowtie-shaped detection envelope.
Figure 3:
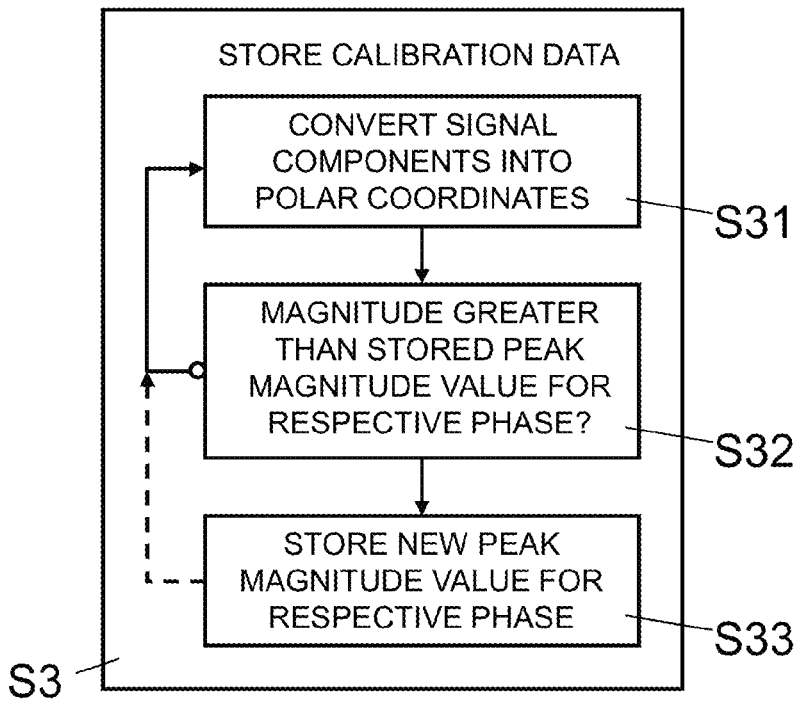
FIG. 3 is a flow diagram illustrating an exemplary sequence of steps for storing calibration data.
Figure 4:
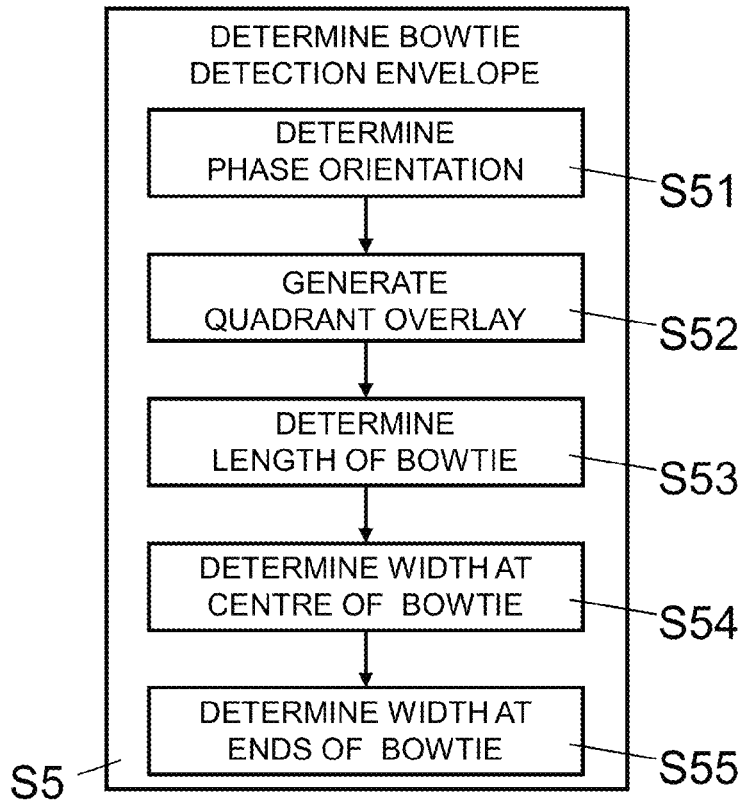
FIG. 4 is a flow diagram illustrating an exemplary sequence of steps for determining a product-specific, bowtie-shaped detection envelope.
Figure 5:
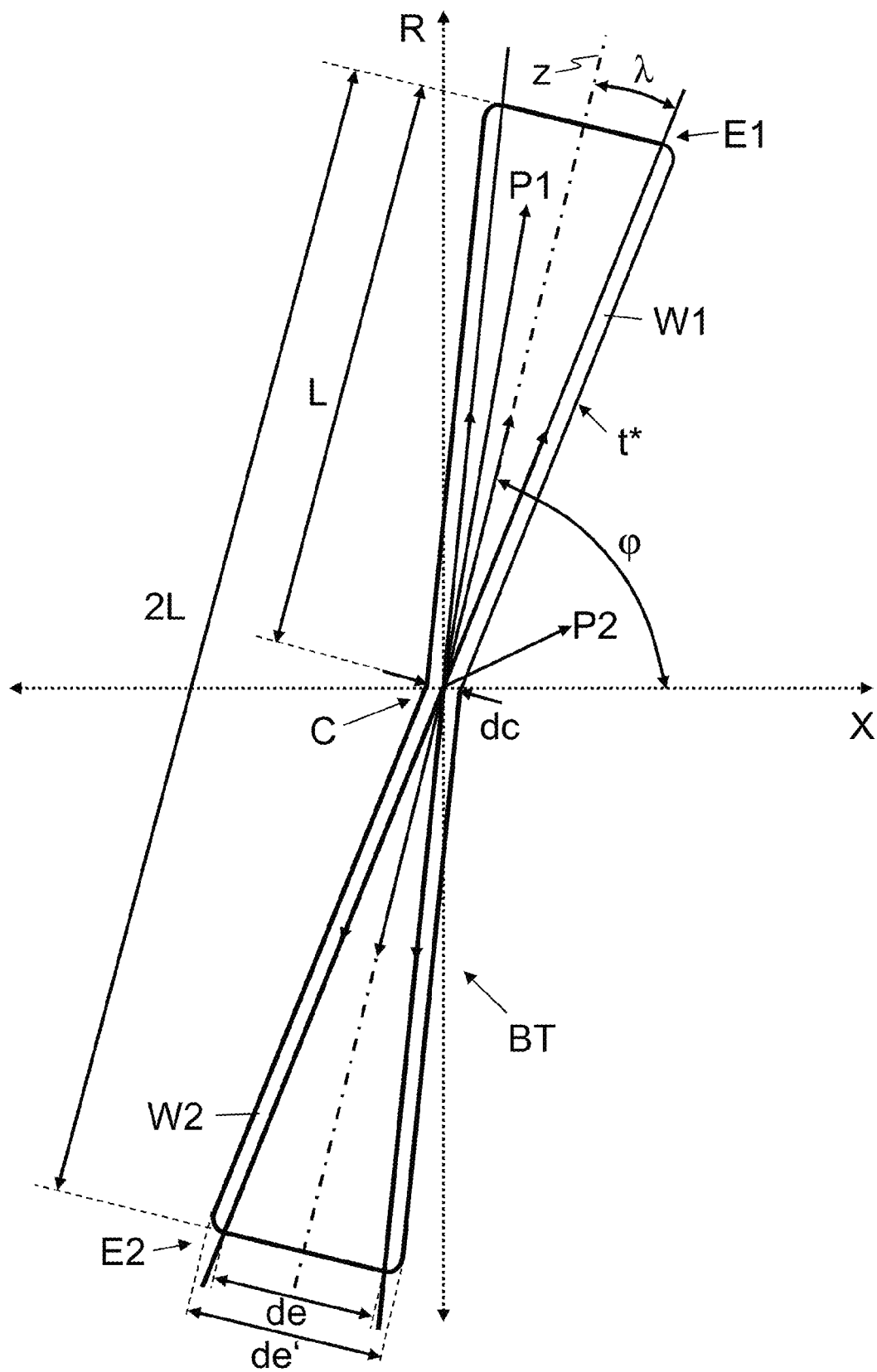
FIG. 5 shows an example of a product-specific, bowtie-shaped detection envelope in a coordinate system having one axis representative of a resistive component and one axis representative of a reactive component.

In the following paragraphs, described with reference to FIGS. 2-4, are possible sequences of steps performed by the functional modules for determining, during a calibration phase Ph1, a product-specific, bowtie-shaped detection envelope BT, as illustrated in FIG. 5, and for detecting, during a measurement phase Ph2, metallic contaminants M in a product P using the product-specific, bowtie-shaped detection envelope BT.

In the calibration phase Ph1, in step S1, a product P is fed to the metal detector 2 where it is transported through the detector's coils or passed by the detector's coils, depending on the type of metal detector 2, respectively. Responsive to the product flow F through the metal detector 2, the metal detector 2 generates a signal S having a resistive component R and a reactive component X, according to the conductivity and magnetic permeability of the product P.

In step S2, in the processing device 1, the calibration module 11 receives the detection signal S from the metal detector 2 via the signal interface 13.

In step S3, the calibration module 11 stores calibration data based on the detection signal S received from the metal detector 2. Specifically, the calibration module 11 stores calibration data which includes the resistive and reactive components R, X of the detection signal S received for the product P.

Figure 6:
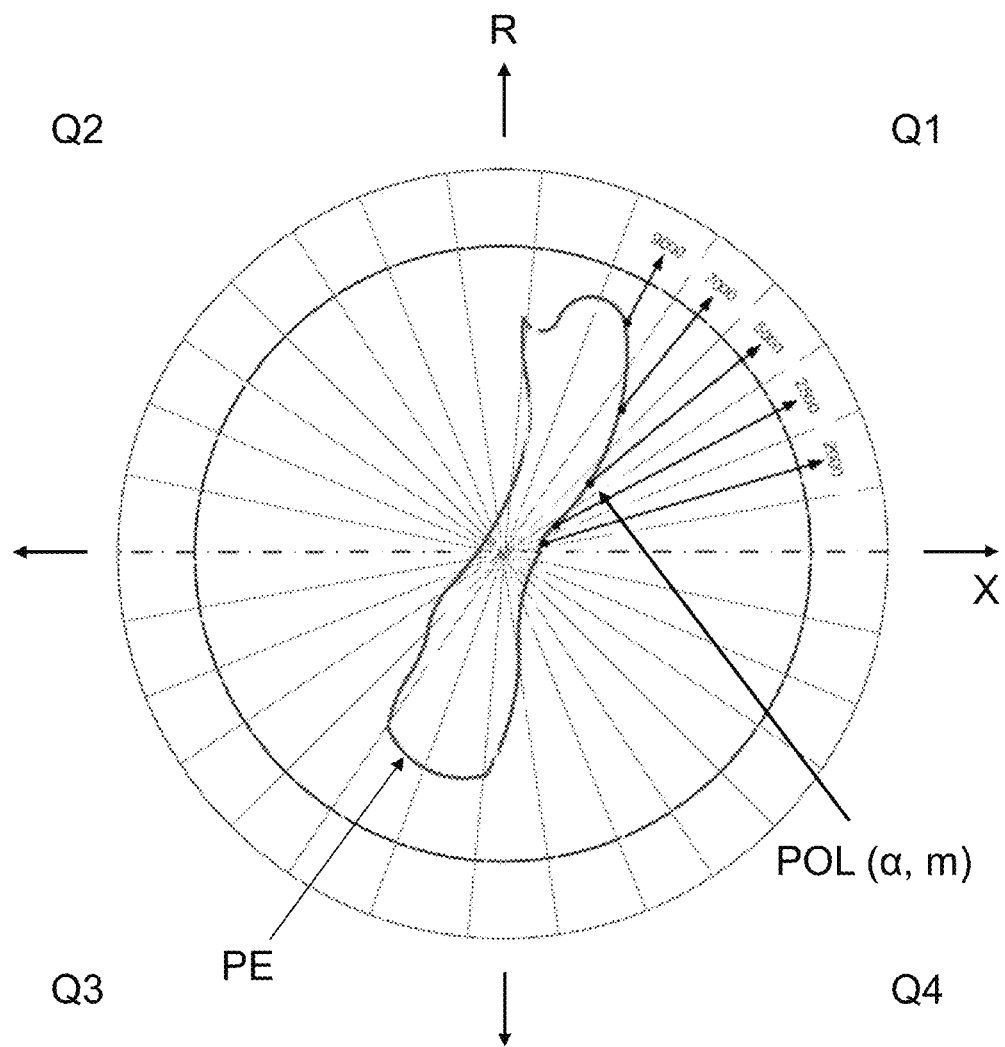
FIG. 6 shows an example of a product envelope based on calibration data in a coordinate system having one axis representative of a resistive component and one axis representative of a reactive component.

In an embodiment illustrated in FIGS. 3 and 6, in step S31, the calibration module 11 converts the resistive component R and reactive component X of the received detection signal S into polar coordinates POL(α, m), comprising a phase value α and a magnitude value m.

In step S32, the calibration module 11 determines whether the magnitude value m of the received detection signal S is a new peak magnitude value, by comparing the magnitude value m to a magnitude value stored previously for the phase value α of the received detection signal S. If the magnitude value m of the received detection signal S is not higher than the previously stored magnitude value, the calibration module 11 continues in step S31 and processes the magnitude value m of the next detection signal S received from the metal detector 2. Otherwise, if the magnitude value m of the received detection signal S is a new peak magnitude value, i.e. it has a higher value than the previously stored magnitude value, in step S33, the calibration module 11 stores the magnitude value m as a new peak magnitude value linked to the phase value α of the received detection signal S. As is shown in FIG. 6, as a result of continued measurements during the calibration phase Ph1, the peak magnitude values m (amplitude) stored assigned to the respective phase value α (phase) of the received detection signals S define a product envelope PE representative for the general (non-contaminated) conductivity and magnetic permeability of the product P.

In step S4, the calibration module 11 determines whether the calibration phase Ph1 is complete. Depending on the embodiment and/or the selected mode of operation, the duration of the calibration phase Ph1 is defined by a defined length of time, e.g. selected depending on the type of product, by a number of specimens or samples of the product P supplied to the metal detector 2, and/or by threshold values defining a maximum variance of the detection signal S. In addition, if instead of multiple specimens or samples of a product P, one long specimen of the product P is supplied to the metal detector 2 during the calibration phase, e.g. a product specimen that is longer than the detection channel of the metal detector 2, the same specimen of the product P is measured (sampled) periodically numerous times and the duration of the calibration phase Ph1 is defined by the length of the specimen of the product and/or by a defined number of measurement samples. If the calibration phase Ph1 is not complete, processing continues in step S1 with the feeding of the next specimen of the product P or the next sampling, respectively. Otherwise, if the calibration phase Ph1 is complete, processing continues in step S5.

In step S5, the calibration module 11 determines the product-specific, bowtie-shaped detection envelope BT using the stored calibration data, i.e. using the product envelope PE defined by the peak magnitude values m assigned to the phase values α, PE={αi, m}, i=0 . . . 360°. FIG. 6 shows an example of the product envelope PE in the X/R-coordinate system. Subsequently, the determined parameters of the product-specific, bowtie-shaped detection envelope BT are stored in the device 1 or on an external data storage device.

Figure 7:
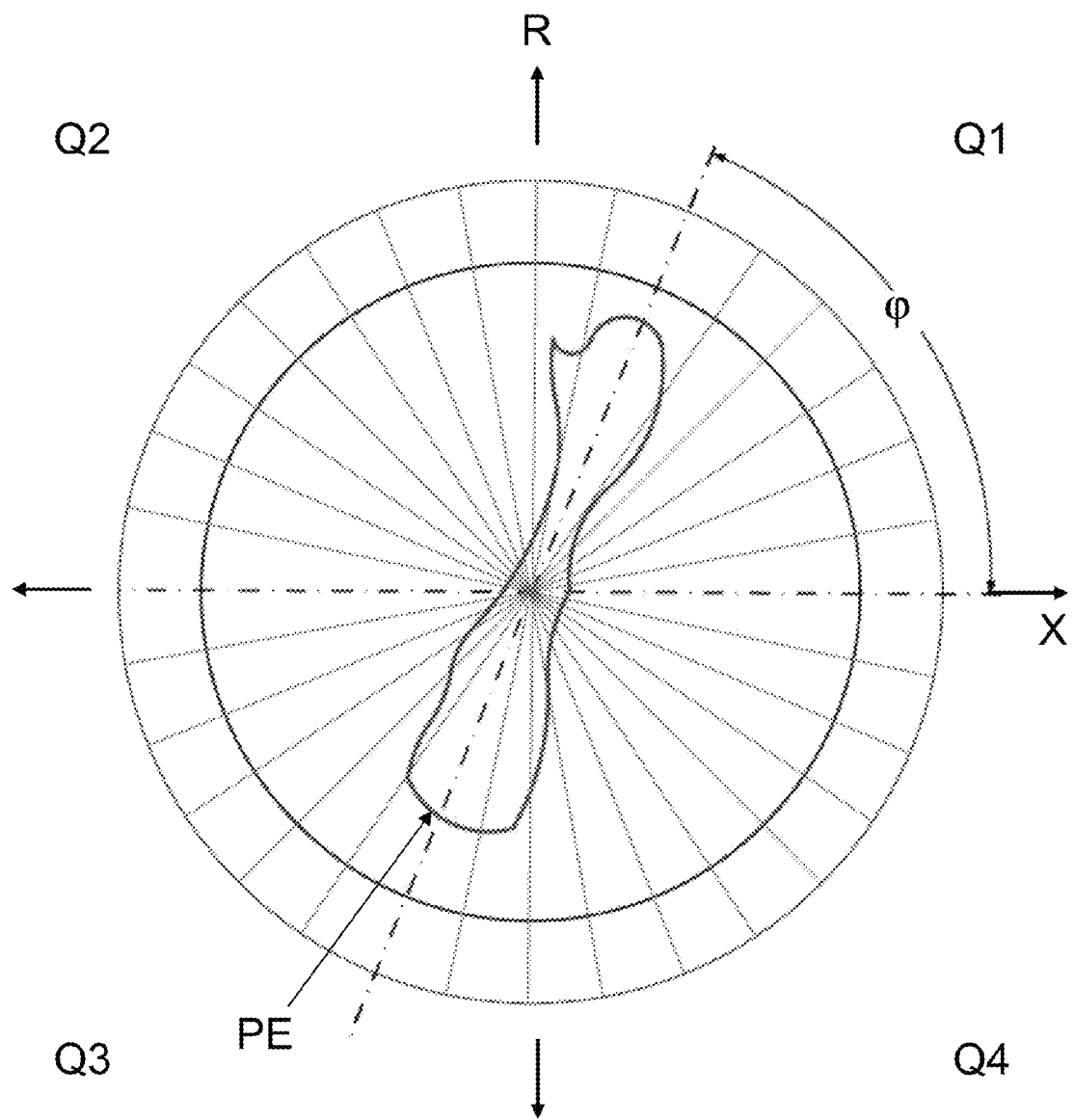
FIG. 7 shows the product phase of the example of the product envelope in the coordinate system.

As illustrated in FIGS. 4 and 7, in step S51, the calibration module 11 determines the phase orientation φ of the product P using the product envelope PE. The product phase φ is defined as the predominant phase of the product envelope PE and is determined by applying a weighted computation algorithm to the stored calibration data, specifically to the product envelope PE defined by the peak magnitude values m assigned to the phase values α, PE={αi, m}, i=0 . . . 360°.

For example, the weighted computation algorithm is configured to determine the product phase φ as the average phase of a product P. The averaging process utilizes all phase specific peak magnitude values m determined with the product envelope PE={αi, m} during the previous steps of the calibration phase Ph1. In order to better distinguish between noise related detection signals S, which are non-directional, and detection signals S caused by the product P, which have a specific direction, all peak magnitude values m are amplified by using their power of 4 values (m4) for the averaging process, for example. This is particularly of relevance, if there are a lot of noise related detection signals S and if the magnitude values m of product related detection signals S are not very large.

The determined product phase φ is set as the phase orientation of the bowtie-shaped detection envelope BT. The phase orientation φ of the bowtie-shaped detection envelope BT also coincides with the longitudinal axis z of the bowtie-shaped detection envelope BT.

Figure 8:
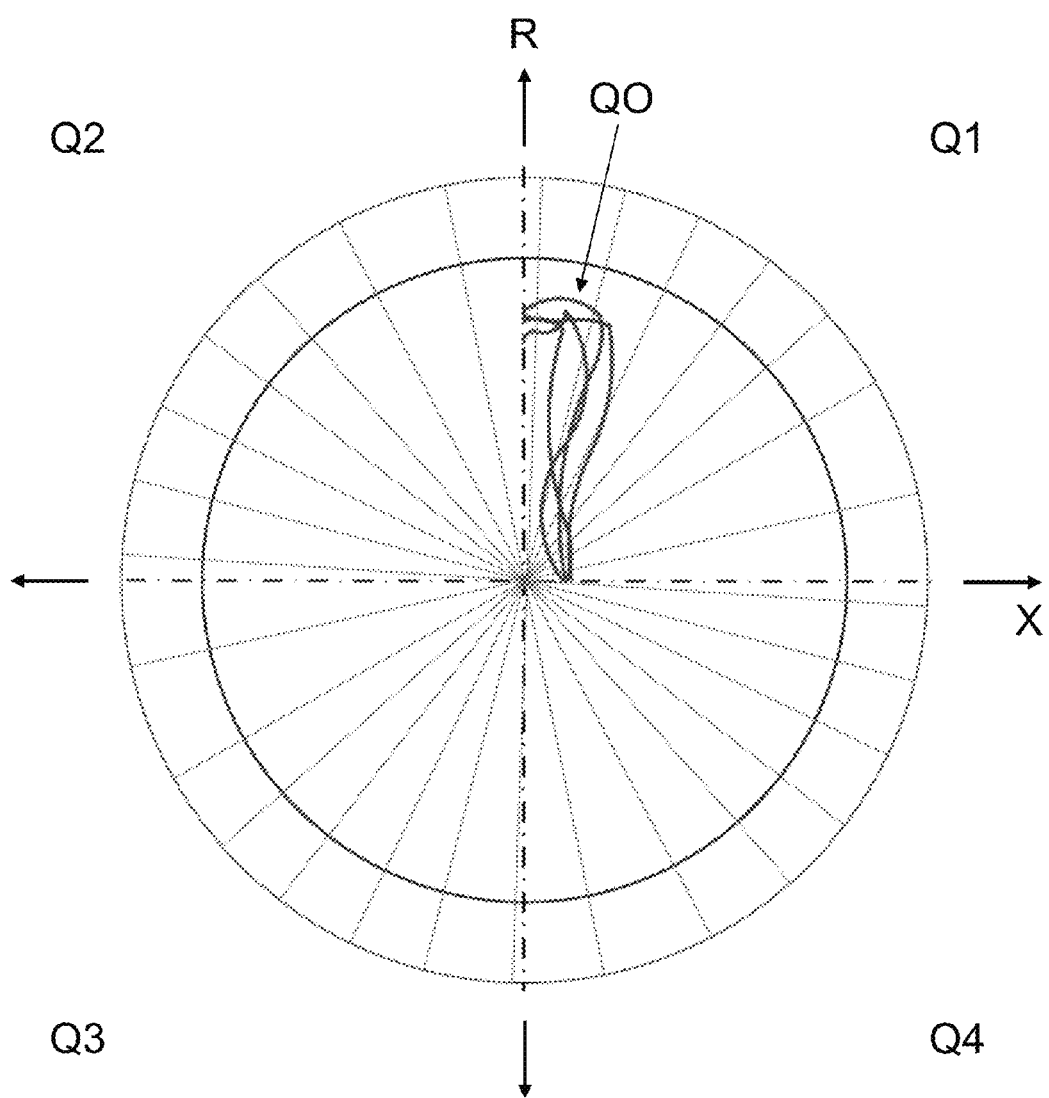
FIG. 8 shows an example of a quadrant overlay of the example of the product envelope in the coordinate system.

In step S52, the calibration module 11 generates a quadrant overlay QO of the product envelope PE, for example, as shown in FIG. 8. The quadrant overlay QO condenses mathematically the information of all four quadrants Q1, Q2, Q3, Q4 of the product envelope PE into one quadrant, e.g. quadrant Q1. To generate the quadrant overlay QO of the product envelope PE, the calibration module 11 aligns the phase orientation φ of the product P or the bowtie-shaped detection envelope BT, respectively, with an axis of a coordinate system, hereinafter referred to as alignment axis. For that purpose, the product envelope PE is rotated about the origin of the X/R-coordinate system, for example, by a rotation angle $\beta = \pi/2 - \phi$, to align the phase orientation φ with one of the axes of the X/R-coordinate system selected as the alignment axis, e.g. the positive R-axis, as shown in FIG. 8. Alternatively, any other axis of the X/R-coordinate system could be used as the alignment axis, or the product envelope PE could be overlaid with a coordinate system having one of its axes—as alignment axis—aligned with the phase orientation φ, without rotating the product envelope PE. Subsequently, the quadrant overlay QO of the product envelope PE is generated through reflection of the product envelope PE about the axes of the respective coordinate system (e.g. reflection about the X-axis: Q3→Q2 and Q4→Q1, and subsequent reflection about R-axis: Q2→Q1, or the other way around), as illustrated in FIG. 8, the information of all four quadrants Q1, Q2, Q3, Q4 is merged, thereby, into one quadrant Q1. Subsequently, the calibration module 11 determines the dimensions of the bowtie-shaped detection envelope BT using the quadrant overlay QO of the product envelope PE.

Figure 9:
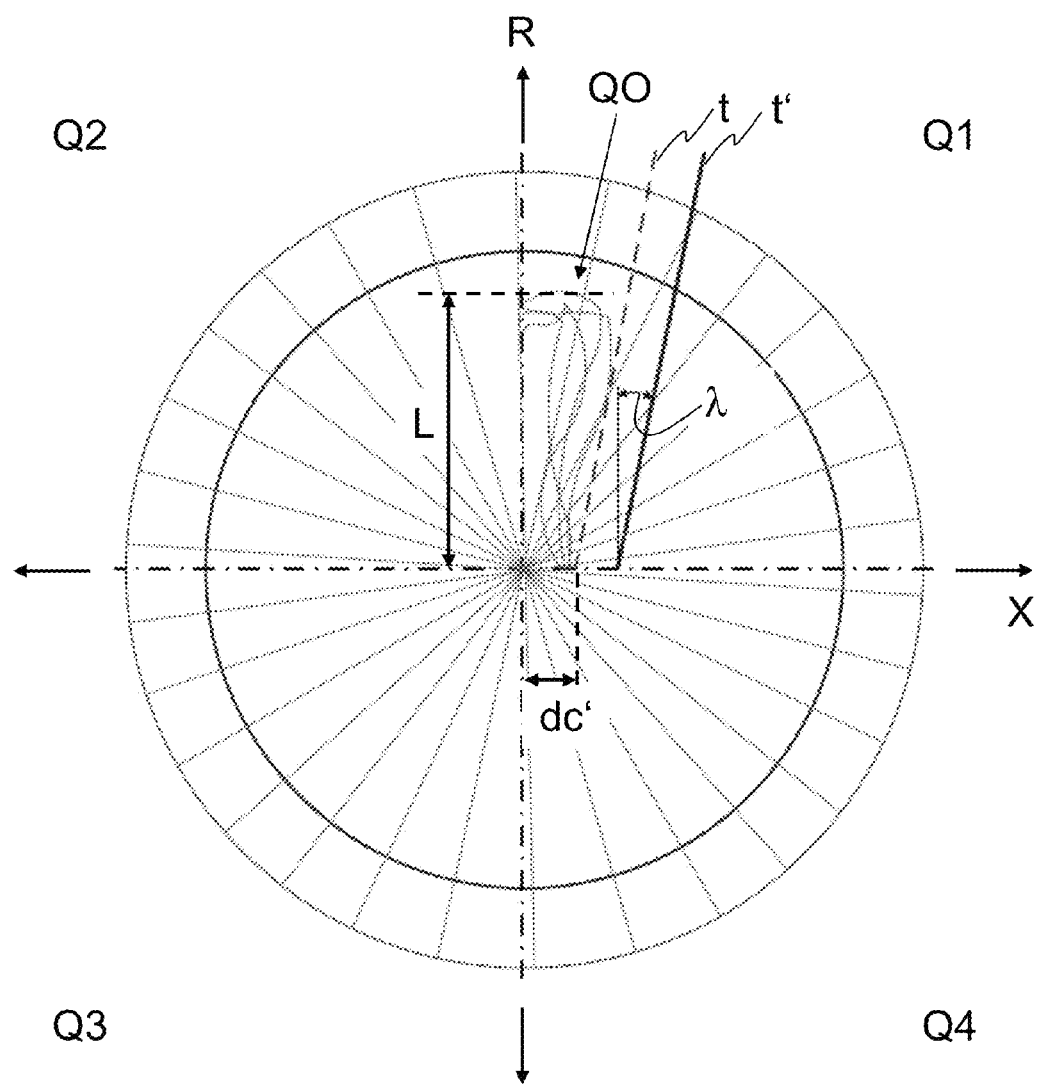
FIG. 9 shows an example of determining the length of the bowtie-shaped detection envelope, its width at its center and its width at its ends from the quadrant overlay.

In step S53, the calibration module 11 determines and stores the length L (2L) of the bowtie-shaped detection envelope BT using the quadrant overlay QO of the product envelope PE. As illustrated in FIG. 9, the length L (2L) of the bowtie-shaped detection envelope BT is defined by the maximum extension of the quadrant overlay QO in the direction of the alignment axis—in the example of FIG. 9, in the direction of the R-axis.

In step S54, the calibration module 11 determines and stores the width dc at the center C of the bowtie-shaped detection envelope BT using the quadrant overlay QO of the product envelope PE. As illustrated in FIG. 9, the width dc at the center C of the bowtie-shaped detection envelope BT is defined by the maximum extension of the quadrant overlay on the axis of the coordinate system orthogonal to the alignment axis—in the example of FIG. 9, on the X-axis (dc=2dc').

In step S55, the calibration module 11 determines and stores the acute angle γ at the center of the bowtie-shaped detection envelope BT and/or the width de, de' at the ends E1, E2 of the of the bowtie-shaped detection envelope BT.

As shown in FIG. 5, the acute angle γ constitutes the phase tolerance of the bowtie-shaped detection envelope BT, i.e. the tolerance from any deviation from the product phase cp. As illustrated in FIG. 9, the acute angle γ or phase tolerance of the bowtie-shaped detection envelope BT, respectively, is determined by way of a tangent t onto the quadrant overlay QO of the product envelope PE and running through the maximum extension dc' of the quadrant overlay QO on the axis of the coordinate system orthogonal to the alignment axis, in the example of FIG. 9, on the X-axis. As is further illustrated, to determine the actual trigger line t' for detecting metallic contaminants M, in an embodiment, the tangent t is moved parallel by a defined tolerance factor, e.g. 75%-125% of in the direction of the X-axis.

If the acute angle γ or phase tolerance of the bowtie-shaped detection envelope BT, respectively, exceeds a defined threshold, e.g. a maximum phase tolerance or corresponding maximum acute angle γmax set by an operator via a user interface, the calibration module 11 sets the phase tolerance or acute angle γ to the defined maximum phase tolerance or acute angle, respectively. The maximum phase tolerance will be exceeded in scenarios where the quadrant overlay QO of the product envelope PE has a shape that results in a tangent t that defines an acute angle γ greater than the defined maximum acute angle γmax. In this case, a tangent tmax defining an acute angle γ set to the defined maximum acute angle γmax is applied onto the quadrant overlay QO of the product envelope PE. Subsequently, the intersection of this "maximum" tangent tmax with the axis of the coordinate system orthogonal to the alignment axis, e.g. the intersection with the X-axis, is determined and its distance to the origin of the coordinate system is stored as the re-adjusted (extended) width dc at the center C of the bowtie-shaped detection envelope BT. In other scenarios where the tangent t defines an acute angle γ or phase tolerance of zero, the detection envelope BT preferably reverts back to an elliptic shape, as will be explained below.

Figure 5A:
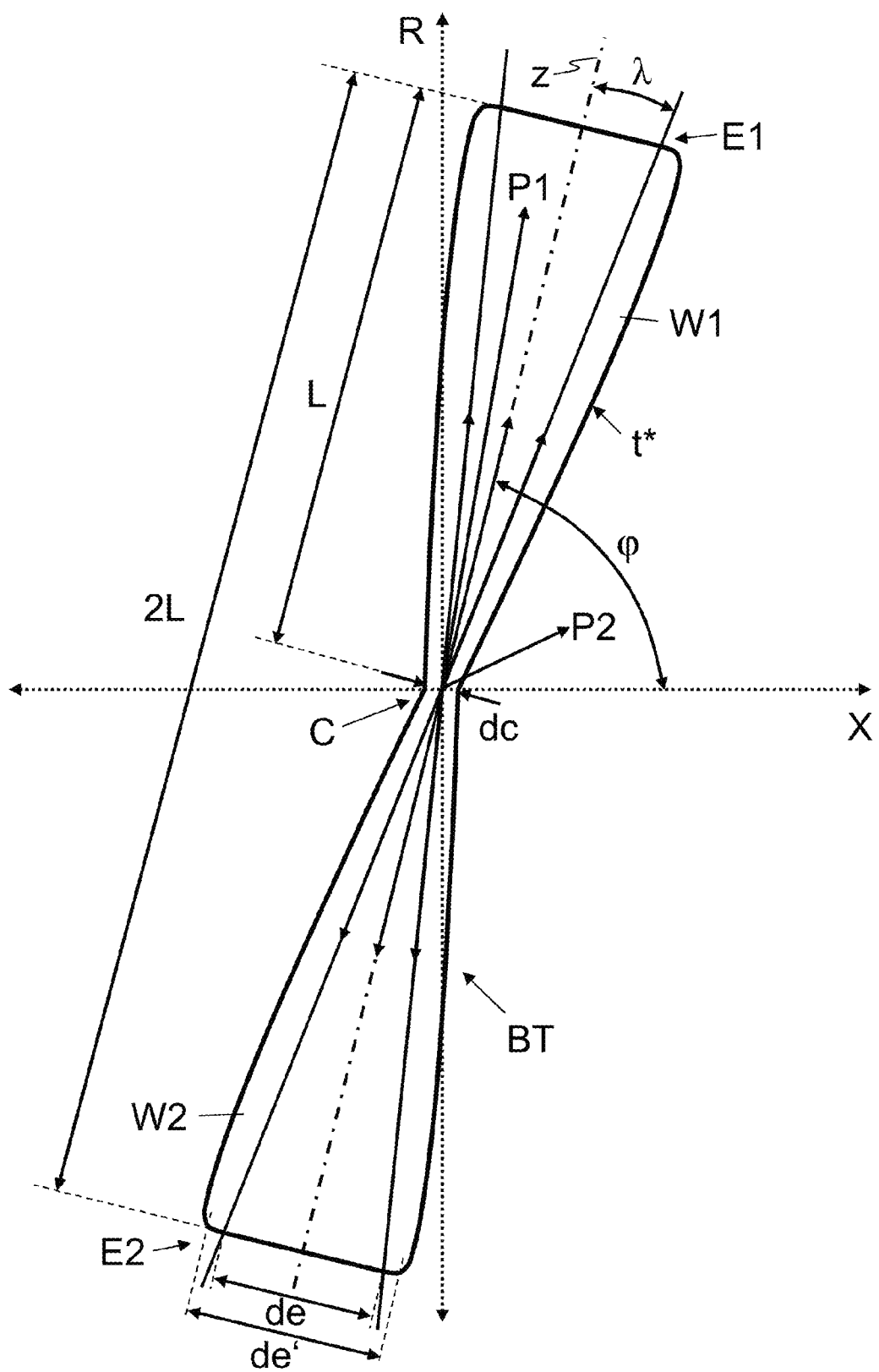
FIG. 5a shows an example of a product-specific, bowtie-shaped detection envelope having wings with curved sides.

FIG. 5 illustrates an example of the bowtie-shaped detection envelope BT having a phase orientation φ defined by its longitudinal axis z, a phase tolerance defined by the acute angle γ and the width dc at its center C, and a length L or 2L, respectively. The width de, de' at the ends E1, E2 of the bowtie-shaped detection envelope BT is defined geometrically by the length L and acute angle γ of the bowtie-shaped detection envelope BT, either taking into consideration the width dc at the center C or not. On skilled in the art will understand that the actual trigger line defined by the outer edge t* and ends E1, E2 of the bowtie-shaped detection envelope BT may be adjusted by variable tolerance factors that extend the length L and width dc, de, de' of the bowtie-shaped detection envelope BT. Moreover, one skilled in the art will understand that the bowtie-shaped detection envelope BT may be configured with a non-symmetrical shape and/or with different types of shapes, e.g. the corners at the ends E1, E2 may be rounded with variable radius or given a sharp edge. The example of the bowtie-shaped detection envelope BT shown in FIG. 5 has wings W1, W1 with sides which extend in each case from the center C to the ends E1, E2 in a rather straight line, and corners at the ends with small radii. FIG. 5a shows an example of a bowtie-shaped detection envelope BT with a different shape having wings W1, W2 with sides which extend in each case from the center C to the ends E1, E2 in a curved line, e.g. a curved line similar to the side of an ellipse split length-wise in half. The shape of the bowtie-shaped detection envelope BT shown in FIG. 5a has the advantage that, if the phase tolerance of the bowtie-shaped detection envelope BT, indicated by the acute angle γ, approaches zero, the shape of the bowtie-shaped detection envelope BT converts seamlessly back to an elliptic shape. In other words, the bowtie-shaped detection envelope BT shown in FIG. 5a has two wings W1, W2, each of them being composed of a triangle, which has at its central corner an angle equal to two times the phase tolerance (2γ), and a quarter of an ellipse attached to both sides of the triangle that meet in the central corner.

In the measurement phase Ph2, in step S6, a product P is fed to the metal detector 2 where it is transported through the metal detector's coils or passed by the detector's coils, depending on the type of metal detector 2, respectively.

In step S7, in the processing device 1, the detection module 12 receives the detection signal S from the metal detector 2 via the signal interface 13.

In step S8, the detection module 12 applies the product-specific, bowtie-shaped detection envelope BT to the detection signal S by comparing in the X/R-coordinate system a vector representation P1, P2 of the detection signal S defined by its resistive component R and its reactive component X to the bowtie-shaped detection envelope BT.

If the detection module 12 determines, in step S9, that the detection signal S or its vector representation P1, P2, respectively, does not exceed the boundaries (trigger line t*) defined by the bowtie-shaped detection envelope BT, as illustrated in FIG. 5 by vector P1, processing continues in step S6 with measuring the next product. Otherwise, if the detection signal S or its vector representation P1, P2, respectively, extends to an area outside the bowtie-shaped detection envelope BT, as illustrated in FIG. 5 by vector P2, the detection module 12 indicates, in step S10, the presence of a metallic contaminant M in the product P, e.g. by way of an acoustic and/or visual alarm signal, and/or by generating a control signal for initiating exception handling, such as automatic removal of the contaminated product P, etc.

It should be noted that, in the description, the computer program code has been associated with specific functional modules and the sequence of the steps has been presented in a specific order, one skilled in the art will understand, however, that the computer program code may be structured differently and that the order of at least some of the steps could be altered, without deviating from the scope of the invention.

While certain exemplary embodiments of the present invention are described in detail above, the scope of the invention is not to be considered limited by such disclosure, and modifications are possible without departing from the spirit of the invention as evidenced by the following claims:

What is claimed is:

1. A device for detecting metallic contaminants in a product using a signal received from a coil-based metal detector, the signal including a resistive component and a reactive component, the device comprising:

a detection module configured to compare, in a coordinate system for the resistive and reactive components, a vector representation of the signal to a product-specific, bowtie-shaped detection envelope, and to indicate a presence of a metallic contaminant in the product when the vector representation of the signal extends to an area outside the bowtie-shaped detection envelope; and a calibration module configured to:

(a) determine the product-specific, bowtie-shaped detection envelope, by receiving from the metal detector during a calibration phase, signals for one or more specimens of the product, and determining a phase orientation and dimensions of the bowtie-shaped detection envelope using the signals, (b) convert the resistive and reactive components of the signals received from the metal detector during the calibration phase into polar coordinates comprising a phase value and a magnitude value, (c) determine a product envelope by determining and storing during the calibration phase a peak magnitude value for each of the phase values, (d) define the bowtie-shaped detection envelope using the product envelope, (e) determine the dimensions of the bowtie-shaped detection envelope by aligning the phase orientation with an axis of a coordinate system selected as the alignment axis, (f) generate a quadrant overlay of the product envelope through reflection of the product envelope about the axes of the coordinate system, (g) determine measurements of the quadrant overlay, and (h) determine the dimensions of the bowtie-shaped detection envelope using the measurements;

wherein the bowtie-shaped detection envelope has two wings that extend from a center of the bowtie-shaped detection envelope in opposite directions along a longitudinal axis to respective ends of the bowtie-shaped detection envelope, the widths of the ends of the bowtie-shaped detection envelope being greater than the width of the center of the bowtie-shaped detection envelope; and wherein the dimensions of the bowtie-shaped detection envelope include at least one of:

(1) the width at the center of the bowtie-shaped detection envelope, (2) the width at the ends of the bowtie-shaped detection envelope, (3) the length of the bowtie-shaped detection envelope along its longitudinal axis, and (4) an acute angle between the longitudinal axis and an outer edge of the bowtie-shaped detection envelope, extending from the center to the ends of the bowtie-shaped detection envelope.

2. The device of claim 1, wherein the calibration module is further configured to determine the phase orientation of the bowtie-shaped detection envelope by applying a weighting function to the peak magnitude values stored for the phase values.

3. The device of claim 1, wherein the calibration module is further configured to:

determine a maximum extension of the quadrant overlay in the direction of the alignment axis;

determine the length of the bowtie-shaped detection envelope using the maximum extension in the direction of the alignment axis;

determine a maximum extension of the quadrant overlay on the axis of a coordinate system orthogonal to the alignment axis; and determine the width at the center of the bowtie-shaped detection envelope using the maximum extension of the quadrant overlay on the orthogonal axis.

4. The device of claim 3, wherein the calibration module is further configured to:

determine a tangent onto the quadrant overlay in one of the quadrants of the coordinate system, the tangent running through a maximum extension of the quadrant overlay on the axis of the coordinate system orthogonal to the alignment axis; and determine at least one of the width at the ends of the bowtie-shaped detection envelope and the acute angle using the tangent.

5. The device of claim 1, wherein the calibration module is further configured to:

determine a tangent onto the quadrant overlay in one of the quadrants of the coordinate system, the tangent running through a maximum extension of the quadrant overlay on the axis of the coordinate system orthogonal to the alignment axis; and determine at least one of the width at the ends of the bowtie-shaped detection envelope and the acute angle using the tangent.

6. A computer-implemented method for detecting metallic contaminants in a product using a signal received from a coil-based metal detector, the signal including a resistive component and a reactive component, the method comprising:

comparing, in a coordinate system for the resistive and reactive components, a vector representation of the signal to a product-specific, bowtie-shaped detection envelope;

determining the product-specific, bowtie-shaped detection envelope by:

(a) receiving from the metal detector during a calibration phase, signals for one or more specimens of the product, and (b) determining a phase orientation of the bowtie-shaped detection envelope using the signals;

determining the dimensions of the bowtie-shaped detection envelope by:

(a) aligning the phase orientation with an axis of a coordinate system selected as the alignment axis, (b) generating a quadrant overlay of the product envelope through reflection of the product envelope about the axes of the coordinate system, (c) determining measurements of the quadrant overlay, and (d) determining the dimensions of the bowtie-shaped detection envelope using the measurements;

converting the resistive and reactive components of the signals received from the metal detector during the calibration phase into polar coordinates comprising a phase value and a magnitude value;

determining a product envelope by determining and storing during the calibration phase a peak magnitude value for each of the phase values;

defining the bowtie-shaped detection envelope using the product envelope; and indicating the presence of a metallic contaminant in the product when the vector representation of the signal extends to an area outside the bowtie-shaped detection envelope;

wherein the bowtie-shaped detection envelope has two wings that extend from a center of the bowtie-shaped detection envelope in opposite directions along a longitudinal axis to respective ends of the bowtie-shaped detection envelope, the width of the ends of the bowtie-shaped detection envelope being greater than the width of the center of the bowtie-shaped detection envelope; and wherein the dimensions include at least one of:

(1) the width at the center of the bowtie-shaped detection envelope, (2) the width at the ends of the bowtie-shaped detection envelope, (3) the length of the bowtie-shaped detection envelope along its longitudinal axis, and
(4) an acute angle between the longitudinal axis and an outer edge of the bowtie-shaped detection envelope, extending from the center to the ends of the bowtie-shaped detection envelope.

7. The method of claim 6, wherein determining the phase orientation of the bowtie-shaped detection envelope further comprises applying a weighting function to the peak magnitude values stored for the phase values.

8. The method of claim 6, further comprising:
determining a maximum extension of the quadrant overlay in the direction of the alignment axis;
determining the length of the bowtie-shaped detection envelope using the maximum extension in the direction of the alignment axis;
determining a maximum extension of the quadrant overlay on the axis of a coordinate system orthogonal to the alignment axis; and
determining the width at the center of the bowtie-shaped detection envelope using the maximum extension of the quadrant overlay on the orthogonal axis.

9. The method of claim 8, further comprising:
determining a tangent onto the quadrant overlay in one of the quadrants of the coordinate system, the tangent running through a maximum extension of the quadrant overlay on the axis of the coordinate system orthogonal to the alignment axis; and
determining at least one of the width at the ends of the bowtie-shaped detection envelope and the acute angle using the tangent.

10. The method of claim 6, further comprising:
determining a tangent onto the quadrant overlay in one of the quadrants of the coordinate system, the tangent running through a maximum extension of the quadrant overlay on the axis of the coordinate system orthogonal to the alignment axis; and
determining at least one of the width at the ends of the bowtie-shaped detection envelope and the acute angle using the tangent.

11. A computer program product comprising a non-transitory computer readable medium having stored thereon computer program code that directs a computer to perform the method of claim 6.

* * * * *